United States Patent [19]

Takashima

[11] Patent Number: 5,124,556

[45] Date of Patent: Jun. 23, 1992

[54] CHARGED PARTICLE BEAM APPARATUS

[75] Inventor: Susumu Takashima, Tokyo, Japan

[73] Assignee: Jeol Ltd., Tokyo, Japan

[21] Appl. No.: 599,658

[22] Filed: Oct. 18, 1990

[30] Foreign Application Priority Data

Oct. 20, 1989 [JP] Japan .................. 1-274533

[51] Int. Cl.$^5$ .............................................. H01J 37/05
[52] U.S. Cl. ................................ 250/396 R; 250/398
[58] Field of Search ............ 250/396 R, 396 ML, 398

[56] References Cited

U.S. PATENT DOCUMENTS

| 4,393,309 | 7/1983 | Norioka | 250/396 R |
| 4,963,737 | 10/1990 | Suzuki | 250/396 R |

FOREIGN PATENT DOCUMENTS

1-159943  6/1989  Japan .............. 250/396 R

*Primary Examiner*—Jack I. Berman
*Attorney, Agent, or Firm*—Webb, Burden, Ziesenheim & Webb

[57] ABSTRACT

There is disclosed a charged particle beam apparatus capable of adjusting the convergence angle of the charged particle probe independent of the current in the probe. The apparatus comprises a charged particle gun producing a charged particle beam, a first condenser lens, a second condenser lens, an objective lens, an aperture, and an auxiliary condenser lens. The first condenser lens, the second condenser lens, and the objective lens which are arranged in this order act to sharply focus the beam to form an charged particle probe impinging on a specimen. The aperture is installed between the second condenser lens and the objective lens. The auxiliary lens is located between the objective lens and the aperture to control the convergence angle of the probe. The passage of the charged particle beam which extends from the aperture to the specimen is wide enough to prevent the current in the charged particle probe striking the specimen from varying if the strength of the auxiliary lens and the strength of the objective lens are varied.

5 Claims, 4 Drawing Sheets

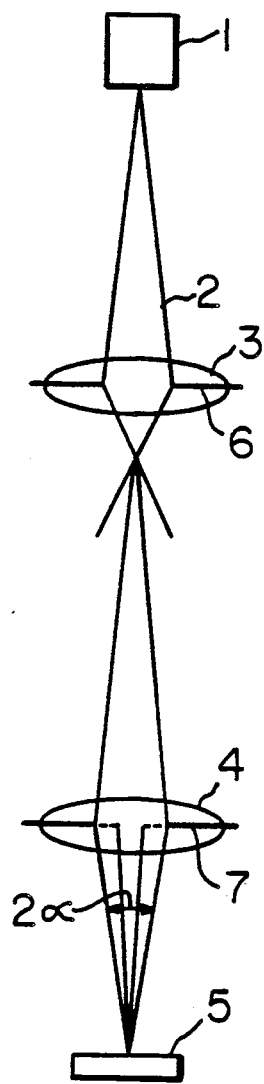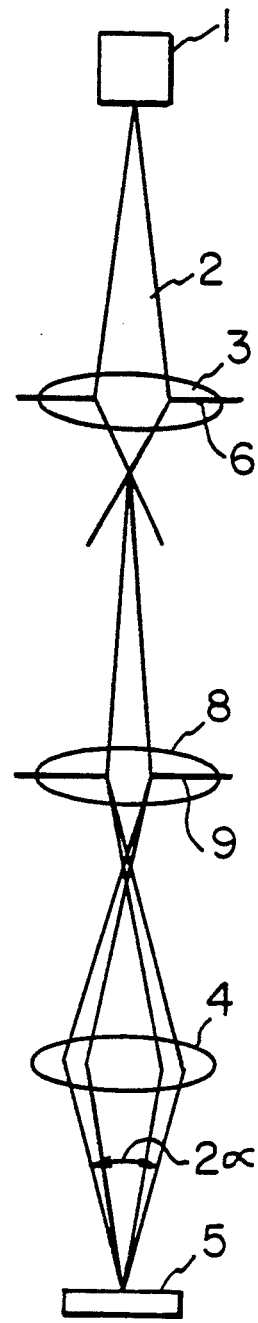
FIG. 1
PRIOR ART
FIG. 2
PRIOR ART

|  | $I_{p1}$ | $I_{p2}$ | $I_{p3}$ |  |  | $I_{pn}$ |
|---|---|---|---|---|---|---|
| $V_{a1}$ | $D_{11}$ | $D_{12}$ | $D_{13}$ |  |  | $D_{1n}$ |
| $V_{a2}$ | $D_{21}$ | $D_{22}$ | $D_{23}$ |  |  | $D_{2n}$ |
| $V_{a3}$ | $D_{31}$ | $D_{32}$ | $D_{33}$ |  |  | $D_{3n}$ |
|  |  |  |  |  |  |  |
| $V_{am}$ | $D_{m1}$ | $D_{m2}$ | $D_{m3}$ |  |  | $D_{mn}$ |

FIG. 4

|  | $I_{p1}$ | $I_{p2}$ | $I_{p3}$ |  | $I_{pj}$ |  | $I_{pn}$ |
|---|---|---|---|---|---|---|---|
| $V_{a1}$ | $V_{aux(11)}$ | $V_{aux(12)}$ | $V_{aux(13)}$ |  | $V_{aux(1j)}$ |  | $V_{aux(1n)}$ |
| $V_{a2}$ | $V_{aux(21)}$ | $V_{aux(22)}$ | $V_{aux(23)}$ |  |  |  | $V_{aux(2n)}$ |
| $V_{a3}$ |  |  |  |  |  |  |  |
|  |  |  |  |  |  |  |  |
| $V_{ai}$ |  |  |  |  | $V_{aux(ij)}$ |  |  |
|  |  |  |  |  |  |  |  |
| $V_{am}$ | $V_{aux(m1)}$ | $V_{aux(m2)}$ | $V_{aux(m3)}$ |  | $V_{aux(mj)}$ |  | $V_{aux(mn)}$ |

FIG. 5

|  | $I_{p1}$ | $I_{p2}$ | $I_{p3}$ |  | $I_{pj}$ |  |  | $I_{pn}$ |
|---|---|---|---|---|---|---|---|---|
| $V_{a1}$ | $I_{OL}(11)$ | $I_{OL}(12)$ | $I_{OL}(13)$ |  | $I_{OL}(1j)$ |  |  | $I_{OL}(1n)$ |
| $V_{a2}$ | $I_{OL}(21)$ | $I_{OL}(22)$ | $I_{OL}(23)$ |  | $I_{OL}(2j)$ |  |  | $I_{OL}(2n)$ |
| $V_{a3}$ |  |  |  |  |  |  |  |  |
|  |  |  |  |  |  |  |  |  |
| $V_{ai}$ |  |  |  |  | $I_{OL}(ij)$ |  |  |  |
|  |  |  |  |  |  |  |  |  |
|  |  |  |  |  |  |  |  |  |
| $V_{am}$ | $I_{OL}(m1)$ | $I_{OL}(m2)$ | $I_{OL}(m3)$ |  | $I_{OL}(mj)$ |  |  | $I_{OL}(mn)$ |

FIG. 7(a)   $\alpha = \alpha_{opt}$

FIG. 7(b)   $\alpha \neq \alpha_{opt}$

CHARGED PARTICLE BEAM APPARATUS

FIELD OF THE INVENTION

The present invention relates to a charged particle beam apparatus, which sharply focuses the charged particle beam emitted from a charged particle gun to form a charged particle probe impinging on a specimen and, more particularly, to a charged particle beam apparatus in which the probe current does not change if the convergence angle of the charged particle probe hitting a specimen is varied. The charged particle beam apparatus includes scanning electron microscope (SEM), electron probe microanalyzer (EPMA), scanning Auger microprobe, focused ion beam apparatus (FIB), etc.

BACKGROUND OF THE INVENTION

In an electron beam apparatus such as an SEM, as the diameter of the electron probe on a specimen is reduced, the specimen image is obtained with higher resolution and higher contrast. It is known that the diameter of the electron probe on the specimen assumes its minimum value when the convergence angle $\alpha$ of the probe takes a certain optimum value $\alpha_{opt}$, and that the optimum value $\alpha_{opt}$ differs, depending on the accelerating voltage $V_a$, on the probe current impinging on the specimen and on the spherical and chromatic aberration coefficients of the final lens. Therefore, whenever at least one of the accelerating voltages and the probe current is varied, the convergence angle is so adjusted as to assume the optimum value $\alpha_{opt}$ under the varied conditions.

One conventional method of adjusting the convergence angle is now described by referring to FIG. 1, where an electron gun 1 produces an electron beam 2 that is focused onto a specimen 5 via a condenser lens 3 and an objective lens 4. The condenser lens 3 and the objective lens 4 are provided with apertures 6 and 7, respectively. The convergence angle $\alpha$ can be changed by replacing the objective lens aperture 7 with an objective lens aperture having a different diameter.

Another conventional method of adjusting the convergence angle is now described by referring to FIG. 2, where an auxiliary lens 8 for adjusting the convergence angle is installed between a condenser lens 3 and an objective lens 4. An aperture 9 is installed in the principal plane of the auxiliary lens 8. The convergence angle can be varied by adjusting the strength of the auxiliary lens 8.

In the conventional method described already in connection with FIG. 1, the diameter of the aperture hole can be switched between several values, at best, practically. Therefore, it is impossible to accomplish the optimum convergence angle, depending on the values of the accelerating voltage and the probe current except for only several conditions.

In the method described in conjunction with FIG. 2, the aperture 9 is located in or close to the principal plane of the auxiliary lens and so, if the strength of the auxiliary lens 8 is changed, the amount of the electron passing through the aperture 9, i.e., the probe current, is varied by the lens effects of the magnetic field distributed upperside of the aperture. Consequently, it is impossible to vary only the convergence angle while maintaining the probe current constant to find out the optimum convergence angle $\alpha_{opt}$. These situations for electron beam apparatus hold for ion beam apparatus, too. The conventional methods for electron beam apparatus illustrated in FIGS. 1 and 2 are disclosed in Japanese Patent Publication No. 10740/1981.

SUMMARY OF THE INVENTION

It is an object of the invention to provide a charged particle beam apparatus which can adjust the convergence angle of the charged particle probe independent of both accelerating voltage and probe current.

It is another object of the invention to provide a charged particle beam apparatus which can irradiate a specimen with a charged particle probe at the optimum convergence angle while automatically minimizing the diameter of the probe.

A charged particle beam apparatus according to the invention comprises: a charged particle gun producing a charged particle beam; a first condenser lens, a second condenser lens, and an objective lens which are arranged in this order to sharply focus the charged particle beam, for forming a charged particle probe impinging on a specimen; an aperture disposed between the second condenser lens and the objective lens; and an auxiliary condenser lens located between the objective lens and the aperture, for controlling the convergence angle of the charged particle probe impinging on the specimen. The passage of the charged particle beam which extends from the aperture to the specimen is made wide enough to prevent the current in the charged particle probe impinging on the specimen from varying if the strength of the auxiliary condenser lens and the strength of the objective lens are changed.

BRIEF DESCRIPTION OF THE DRAWINGS

FIG. 1 is a diagram illustrating a conventional method of adjusting the convergence angle of an electron probe;

FIG. 2 is a diagram illustrating another conventional method of adjusting the convergence angle of an electron probe;

FIG. 4 is a diagram illustrating one example of the table stored in the memory 28 shown in FIG. 3;

FIG. 5 is a diagram illustrating one example of the table stored in the memory 29 shown in FIG. 3;

FIG. 7(a) is a graph showing the current density distribution of the charged particle probe created by the charged particle beam apparatus in which the convergence angle of the charged particle probe is adjusted properly; and FIG. 7(b) is a graph similar to FIG. 7(a), but in which the convergence angle of the charged particle probe is adjusted inappropriately.

DETAILED DESCRIPTION OF THE PREFERRED EMBODIMENT

Figure 3:
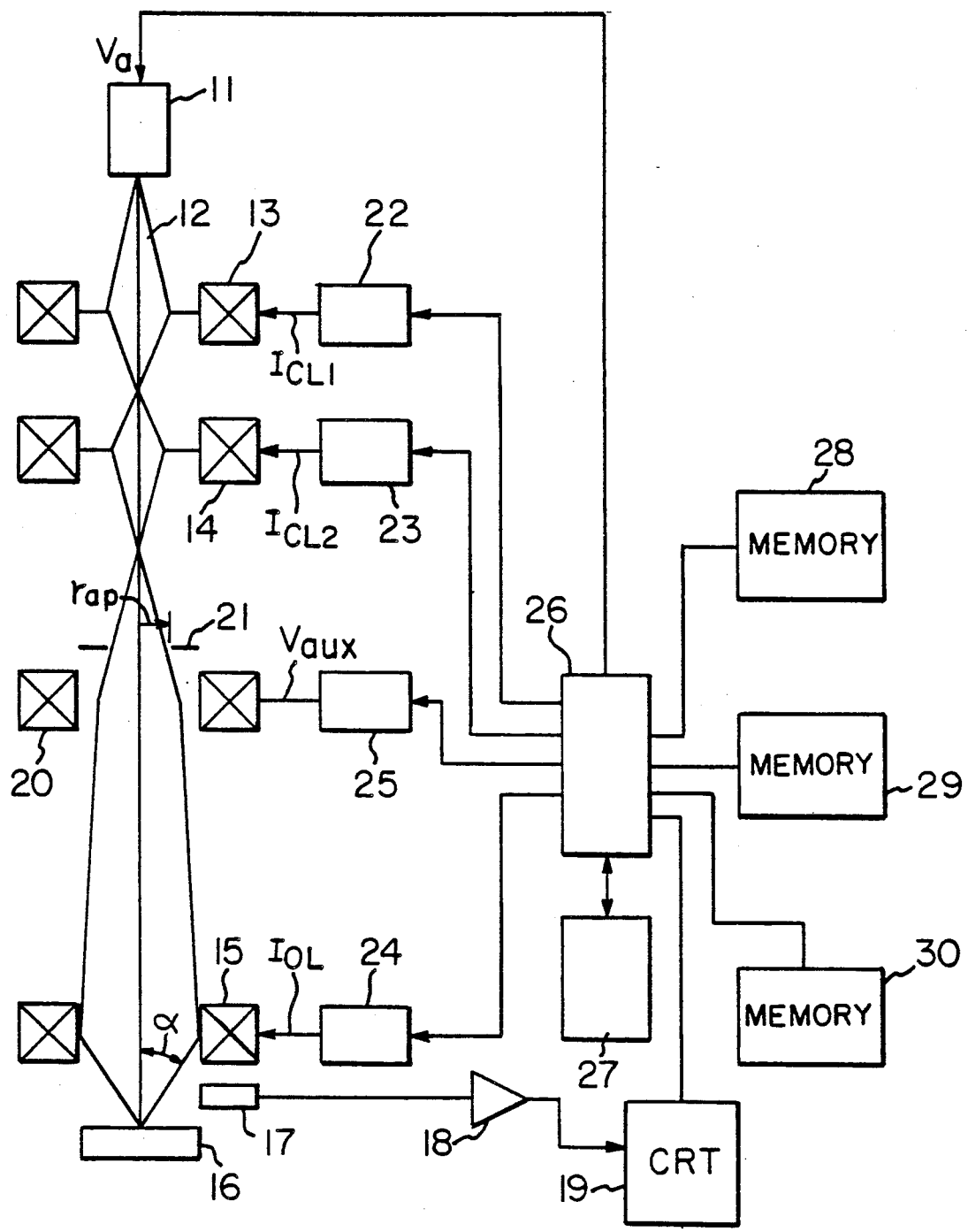
FIG. 3 is a block diagram of an apparatus utilizing a charged particle probe according to the invention.

Referring to FIG. 3, there is shown an apparatus utilizing a charged particle probe embodying the concept of the present invention. This apparatus comprises a charged particle gun 11 producing a charged particle beam 12, a first condenser lens 13, a second condenser lens 14, a third condenser lens (or objective lens) 15, an auxiliary lens 20 disposed between the second condenser lens 14 and the objective lens 15 for adjusting the convergence angle of the charged particle probe, an aperture 21 disposed between the auxiliary lens 20 and the second condenser lens 14, a secondary charged particle detector 17, an amplifier 18 connected with the detector 17, a display unit 19 connected with the amplifier 18, a power supply 22 exciting the condenser lens 13, a power supply 23 exciting the condenser lens 14, a power supply 24 exciting the objective lens 15, a power supply 25 exciting the auxiliary lens 20, and a control section 26 to which the power supplies 22-25 are connected. The strengths of the lenses are controlled by their respective power supplies under the control of the control section 26. An entry device 27 such as a keyboard, memories 28, 29, and 30 are also connected with the control section 26.

The charged particle beam 12 emitted from the charged particle gun 11 is focused onto a specimen 16 by the lenses 13-15. The bombardment of the charged particle beam, or charged particle probe, produces secondary electrons which are detected by the detector 17. The output signal from the detector 17 is fed as a video signal via the amplifier 18 to the display unit 19. Preferably, the auxiliary lens 20 is an electrostatic lens which exhibits no hystresis and whose focal length can be set with high reproducibility.

Where the accelerating voltage is $V_a$, the current $I_p$ in the probe impinging on the specimen 16 is determined by the aperture 21, the strengths of the condenser lenses 13 and 14. In particular, the amount of charged particles passing through the aperture 21, i.e., the current, can be adjusted at will by adjusting the focal lengths of the first condenser lens 13 and the second condenser lens 14. The auxiliary lens 20 and the objective lens 15 which are located behind the aperture 21 are equipped with no aperture, and a sufficiently wide charged particle beam passage is secured. Therefore, if the focal lengths are adjusted to vary the strengths of the auxiliary lens 20 and the objective lens 15, all the charged particle beam passed through the aperture 21 hits the specimen 16 without colliding with any obstacle. For this reason, once the probe current has been determined by adjusting the condenser lenses 13 and 14, the probe current does not vary if the convergence angle $\alpha$ of the charged particle probe impinging on the specimen is adjusted by adjusting the strength of the auxiliary lens 20. Hence, the convergence angle can be adjusted independent of the probe current.

It is now assumed that the accelerating voltage can be changed from $V_{al}$ to $V_{am}$ and switched between m different values, and that the probe current can be varied from $I_{p1}$ to $I_{pn}$ and switched between n different values. A table of data ($D_{11}$-$D_{mn}$) indicating various sets of strengths of the lenses 13 and 14, e.g., excitation currents $I_{CL1}$ and $I_{CL2}$, which are needed to set probe current to $I_{p1}$ to $I_{pn}$ is stored in the memory 28. In this table, each value of the accelerating voltage ranging from $V_{al}$ to $V_{am}$ and probe current $I_p$ are taken as a parameter. FIG. 4 shows one example of the table.

A table of data indicating various strengths of the auxiliary lens 20, e.g., excitation voltage $V_{aux}$, which give the optimum convergence angle $\alpha_{opt}$ that has been previously found for every possible set of the values of the accelerating voltage $V_a$ and the probe current $I_p$ is stored in the memory 29. In this table, the accelerating voltage $V_a$ and the probe current $I_p$ are taken as parameters. One example of the table is shown in FIG. 5.

Stored in the memory 30 is a table of data indicating various strengths of the objective lens 15 which are needed to focus the charged particle beam onto the specimen, e.g., excitation current $I_{OL}$, for every possible strength of the auxiliary lens 20 providing control of the convergence angle. In this table, the accelerating voltage $V_a$ and the probe current $I_p$ are taken as parameters. One example of the table is shown in FIG. 6.

Figure 6:
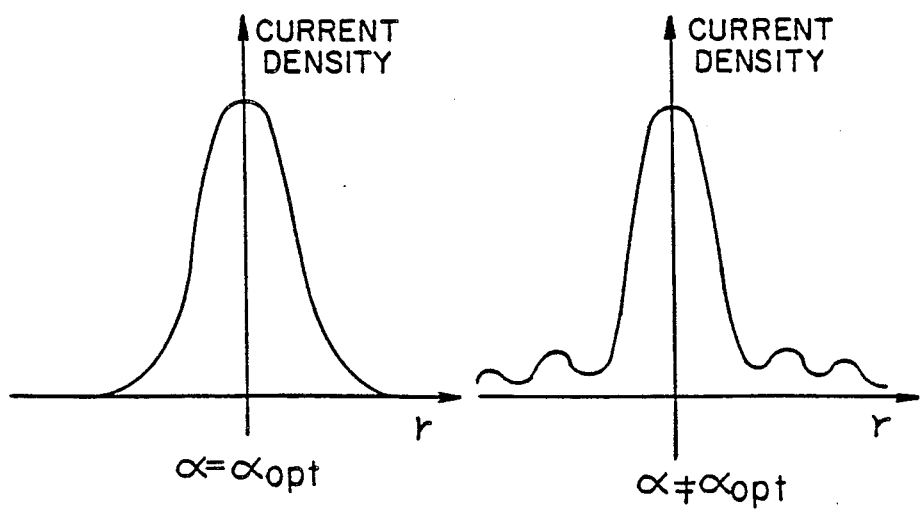
FIG. 6 is a diagram illustrating one example of the table stored in the memory 30 shown in FIG. 3.

The table shown in FIG. 5 concerning the voltage exciting the auxiliary lens 20 and the table shown in FIG. 6 concerning the current exciting the objective lens 15 are created in the manner described now.

At first, the accelerating voltage $V_a$ is set to a certain value $V_{ai}$ ($1 \leq i \leq m$). The probe current is set to a certain value $I_{pj}$ ($1 \leq j \leq n$). The voltage $V_{aux}$ exciting the auxiliary lens 20 is switched between various values. Whenever the excitation voltage $V_{aux}$ is switched, the current $I_{OL}$ exciting the objective lens 15 is adjusted to bring the charged particle beam to a focus, in order to find out such a set of values of the excitation voltage applied to the auxiliary lens 20 and the excitation current fed to the objective lens 15 which produces an image with the highest resolution and the best signal-to-noise ratio. Under this optimum condition, the diameter of the charged particle probe is smallest. Therefore, the convergence angle of the probe assumes the optimum angle $\alpha_{opt}$. In the case of a charged particle beam apparatus, the current density distribution taken in a radial direction $\gamma$ of the charged particle probe impinging on the specimen 4 is shown in FIG. 7(a). As can be seen from this graph, the current density attenuates rapidly at the fringe of the probe. FIG. 7(b) shows the current density distribution of the charged particle probe when the convergence angle $\alpha$ set by the auxiliary lens 20 is not appropriate. In this case, the current density fluctuates near the fringe, making it impossible to realize high resolution and good signal-to-noise ratio.

If an image with the highest resolution and good signal-to-noise ratio is successfully found out in this single operation, then the value of the excitation voltage $V_{aux}$(ij) applied to the auxiliary lens 20 under these conditions, i.e., $V_a = V_{ai}$ and $I_p = I_{pj}$ is stored in the memory 29 together with $V_{ai}$ and $I_{pj}$. Also, the value of the excitation current $I_{OL}$(ij) fed to the objective lens 3 at this time is stored in the memory 30 along with $V_{ai}$ and $I_{pj}$.

In this way, the excitation voltage to the auxiliary lens 20 and the excitation current to the objective lens 15 which provide the optimum convergence angle of the probe are found for every possible set of values of the accelerating voltage $V_a$ and the probe current $I_p$. The found values are stored in the memories 29 and 30, respectively. When this operation is finished, the tables shown in FIGS. 5 and 6 are created in the memories 29 and 30, respectively.

After such preparations are completed in this way, the operator enters an accelerating voltage value, e.g., $V_{au}$ and a probe current value, e.g., $I_{pv}$, through the keyboard 27. Then, the control section 26 controls the charged particle gun 11 so that the charged particle beam may be accelerated at the specified accelerating voltage $V_{au}$. At the same time, the control section 26 reads data indicating a set of values corresponding to the accelerating voltage $V_{au}$ and the probe current $I_{pv}$ from the table stored in the memory 28. The excitation power supplies 10 and 11 for the first condenser lens 13 and the second condenser lens 14, respectively, are controlled according to the data read from the table. As a result, the condenser lenses 13 and 14 are so excited that the probe current becomes $I_{pv}$ at the accelerating voltage $V_{au}$.

The control section 26 reads data $V_{aux}(uv)$ corresponding to both accelerating voltage $V_{au}$ and probe current $I_{pv}$, from the table stored in the memory 29. The power supply 25 applies the excitation voltage $V_{aux}(uv)$ to the auxiliary lens 20 according to the data read out. At the same time, the control section 26 reads the excitation current value $I_{0L}(uv)$ corresponding to the accelerating voltage and the probe current $I_{pv}$, from the memory 30 in the same way, the excitation current being fed to the objective lens 15. The lens 15 is excited according to the data read out.

As a result, the charged particle probe which has a current value $I_{pv}$ and is accelerated at the accelerating voltage $V_{au}$ is caused to hit the specimen 4 at the optimum convergence angle. Under this condition, the charged particle probe is raster-scanned by a deflector (not shown). Concomitantly, the secondary charged particle detector 17 produces an output signal, which is fed to the display unit 19. Consequently, a scanning electron micrograph with high resolution and high signal-to-noise ratio is presented on the viewing screen of the display unit.

While there has been described a preferred form of the invention, obviously modifications and variations are possible in light of the above teachings. In the above example, a table of values of the excitation current fed to the objective lens 15 is stored in one memory. Sometimes, it is necessary to more finely focus the objective lens 15 according to the topography of the specimen surface. In this case, any table of various values of the excitation current fed to the objective lens 15 is not created; the excitation current may be manually adjusted. Also in the above example, an electrostatic lens is used as the lens providing control of the convergence angle. Instead, a magnetic lens may be employed.

As described thus far, in accordance with the present invention, an aperture is installed between the second condenser lens and the objective lens. An auxiliary lens is installed between the objective lens and the aperture to control the convergence angle of the charged particle probe striking the specimen. Thus, a charged particle beam apparatus is offered which can adjust the convergence angle of the charged particle probe independent of the probe current. Furthermore, an image with high resolution and high signal-to-noise ratio is automatically obtained simply by specifying the values of the accelerating voltage and the charged particle probe current.

Having thus described my invention with the detail and particularity required by the Patent Laws, what is claimed and desired to be protected by Letters Patent is set forth in the following claims.

What is claimed is:

1. A charged particle beam apparatus comprising:
    a charged particle gun producing a charged particle beam;
    a first condenser lens, a second condenser lens, and an objective lens which are arranged in this order to sharply focus the charged particle beam;
    an aperture disposed between the second condenser lens and the objective lens;
    said gun, first and second condenser lenses and aperture arranged for forming a charged particle probe for impinging the specimen;
    an auxiliary lens for controlling the convergence angle of the charged particle probe on the specimen, the auxiliary lens being located between the objective lens and the aperture,
    means for selecting a probe current value;
    means for controlling the strengths of the first and second condenser lenses to provide a selected probe current passing through the aperture; and
    means for controlling the auxiliary lens and the objective lenses with reference to the strengths of the first and second condenser lenses so that the convergence angle of the charged particle probe impinging on the specimen is optimum while most sharply focusing the particle beam.

2. The charged particle beam apparatus of claim 1, wherein said auxiliary lens is an electrostatic lens.

3. The charged particle beam apparatus of claim 1 or 2, further including:
    means for selecting an accelerating voltage value and means to control the particle gun to provide the selected accelerating voltage value;
    a memory storing a table of data defining various sets of values of the strengths of the first and second condenser lenses determining probe current values, the table containing the accelerating voltage of the charged particle gun and the probe current as parameters;
    a means for reading a certain set of strengths from the table according to the selected values of the accelerating voltage and the probe current; and
    means which excite the first and second condenser lenses according to the certain set of strengths read from the memory.

4. The charged particle beam apparatus of claim 3, further including:
    a second memory storing a second table of data defining the strengths of the auxiliary lens which provide the optimum convergence angles while most sharply focusing the charged particle beam; and
    a means which reads data defining a certain strength of the auxiliary lens from the second table according to the selected values of the accelerating voltage and the probe current and which excites the auxiliary lens according to the data read from the second table.

5. The charged particle beam apparatus of claim 4, further including:
    a third memory storing a third table of data defining various strengths of the objective lens which can focus the charged particle beam most sharply, the third table containing the probe current and the accelerating voltage as parameters; and
    a means which reads data defining a certain strength of the objective lens from the third table according to its input data bout the accelerating voltage and the probe current and which excites the objective lens according to the data read from the third table.

* * * * *

UNITED STATES PATENT AND TRADEMARK OFFICE
CERTIFICATE OF CORRECTION

PATENT NO. : 5,124,556
DATED : June 23, 1992
INVENTOR(S) : Susumu Takashima

It is certified that error appears in the above-identified patent and that said Letters Patent is hereby corrected as shown below:

Title page, item, [73] Assignee: "Jeol" should read --JEOL--.

Column 4 Line 39 "$I_p=I_{pj}$" should read --$I_p=I_{pj}$--.

Claim 1 Line 5 Column 6 after "probe" insert --impinging--.

Claim 5 Line 58 Column 6 "bout" should read --about--.

Signed and Sealed this

Twenty-fourth Day of August, 1993

Attest:

BRUCE LEHMAN

Attesting Officer

Commissioner of Patents and Trademarks